United States Patent
Raghavan et al.

(10) Patent No.: US 11,973,137 B2
(45) Date of Patent: Apr. 30, 2024

(54) STACKED BUFFER IN TRANSISTORS

(71) Applicant: Indian Institute of Science, Bangalore (IN)

(72) Inventors: Srinivasan Raghavan, Bangalore (IN); Navakanta Bhat, Bangalore (IN); Rohith Soman, Bangalore (IN)

(73) Assignee: Indian Institute of Science, Bangalore Karnataka (IN)

( * ) Notice: Subject to any disclaimer, the term of this patent is extended or adjusted under 35 U.S.C. 154(b) by 513 days.

(21) Appl. No.: 17/309,583

(22) PCT Filed: Dec. 5, 2019

(86) PCT No.: PCT/IN2019/050886
§ 371 (c)(1),
(2) Date: Jun. 7, 2021

(87) PCT Pub. No.: WO2020/115766
PCT Pub. Date: Jun. 11, 2020

(65) Prior Publication Data
US 2022/0020871 A1   Jan. 20, 2022

(30) Foreign Application Priority Data
Dec. 7, 2018 (IN) .............................. 201841046481

(51) Int. Cl.
*H01L 29/778* (2006.01)
*H01L 29/06* (2006.01)

(52) U.S. Cl.
CPC ...... *H01L 29/7786* (2013.01); *H01L 29/0638* (2013.01)

(58) Field of Classification Search
CPC .................................................. H01L 29/7786
USPC ........................................................ 257/194
See application file for complete search history.

(56) References Cited

U.S. PATENT DOCUMENTS

| 10,658,471 B2* | 5/2020 | Dasgupta ............ H01L 27/1207 |
| 2012/0025270 A1 | 2/2012 | Chang et al. |
| 2012/0238064 A1 | 9/2012 | Chang et al. |
| 2014/0094223 A1* | 4/2014 | Dasgupta ............. H01L 23/535 |
| | | 455/566 |

FOREIGN PATENT DOCUMENTS

| JP | 2012028725 A | 2/2012 |
| WO | WO-2014051779 A1 | 4/2014 |
| WO | WO-2020115766 A1 | 6/2020 |

OTHER PUBLICATIONS

"International Application No. PCT/IN2019/050886, International Search Report and Written Opinion dated Feb. 19, 2020", (dated Feb. 19, 2020), 10 pgs.

* cited by examiner

*Primary Examiner* — Ajay Arora
(74) *Attorney, Agent, or Firm* — Schwegman Lundberg & Woessner, P.A.

(57) ABSTRACT

The present subject matter provides a High Mobility Electron Transistor (HEMT) comprising: a substrate, a nucleation layer provided on the substrate, a channel layer, and a buffer layer formed between the nucleation layer and the channel layer. The buffer layer comprises a vertical stack of p-n junctions. Each p-n junction of the vertical stack of p-n junctions comprises an n-type layer provided on a p-type layer. The n-type layer and the p-type layer are parallel to the substrate.

13 Claims, 8 Drawing Sheets

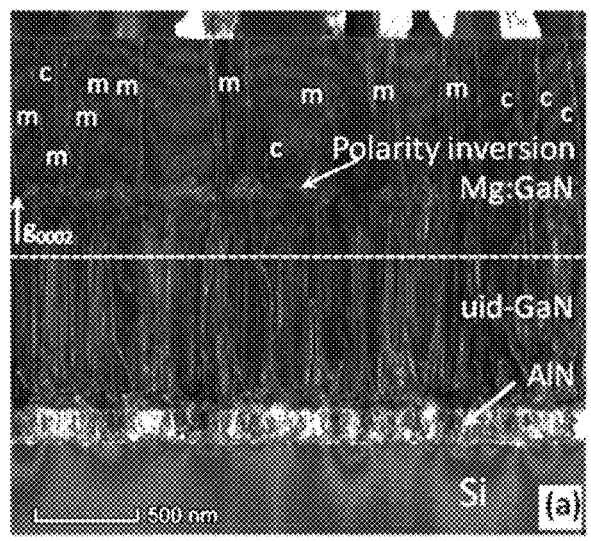 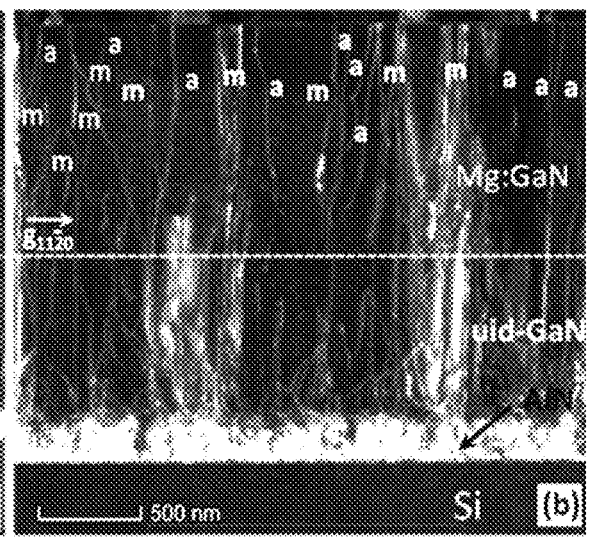
Fig. 8(a)  Fig. 8(b)
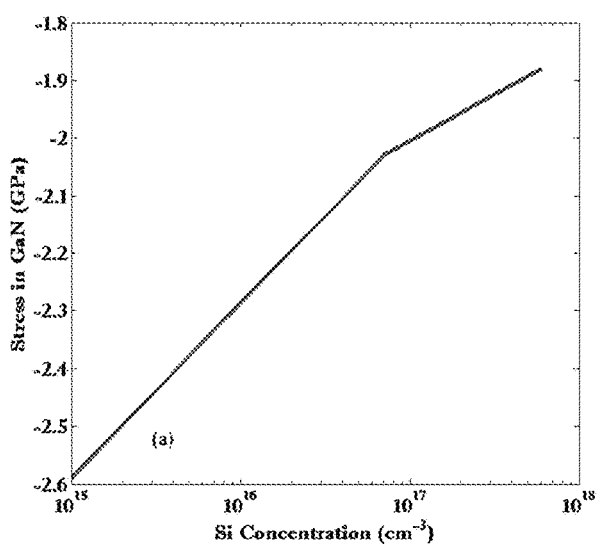 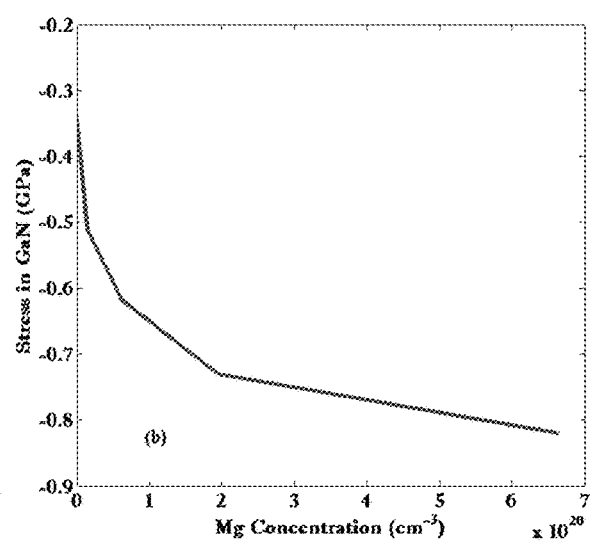
Fig. 9(a)  Fig. 9(b)

STACKED BUFFER IN TRANSISTORS

PRIORITY CLAIM TO RELATED APPLICATIONS

This application is a U.S. national stage filing under 35 U.S.C. § 371 from International Application No. PCT/IN2019/050886, filed on 5 Dec. 2019, and published as WO2020/115766 on 11 Jun. 2020, which claims the benefit under 35 U.S.C. 119 to India Application No. 201841046481, filed on 7 Dec. 2018, the benefit of priority of each of which is claimed herein, and which applications and publication are hereby incorporated herein by reference in their entirety.

TECHNICAL FIELD

The present subject matter relates in general to transistors, and in particular to p-n junction stacked buffer in III-nitride transistors.

BACKGROUND

Gallium nitride (GaN) based power switches can be used in different types of systems with high voltage rating. Wide band gap, formation of two-dimensional electron gas (2DEG) at the hetero-interface, and high thermal conductivity makes AlGaN/GaN High Electron Mobility Transistors (HEMTs) promising candidates for high power electronics applications.

Silicon is generally used as a substrate for growth of AlGaN/GaN HEMT because of its low cost and availability in large dimensions compared to other substrates like SiC or sapphire. To overcome lattice mismatch and thermal expansion coefficient mismatch of GaN with silicon, an aluminium nitride (AlN) nucleation layer and an AlGaN transition layer are grown on the silicon substrate followed by a buffer layer. AlGaN/GaN HEMT stack is then grown on the buffer layer. The 2DEG is formed at the AlGaN/GaN hetero interface, which enables the operation of the HEMT.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

FIGS. 8 (a) and (b) show a cross sectional Transmission Electron Microscope (TEM) image of the stack highlighting the dislocation bending with Mg doping, in accordance with an implementation of the present subject matter.

FIG. 9 (a) shows the experimental result of stress variation in GaN with Si doping, in accordance with an implementation of the present subject matter.

FIG. 9 (b) shows the experimental result of stress variation in GaN with Mg doping, in accordance with an implementation of the present subject matter.

DETAILED DESCRIPTION

The present subject matter provides a vertically stacked buffer layer for High Electron Mobility Transistors (HEMTs) and HEMTs therefrom.

Figure 1:
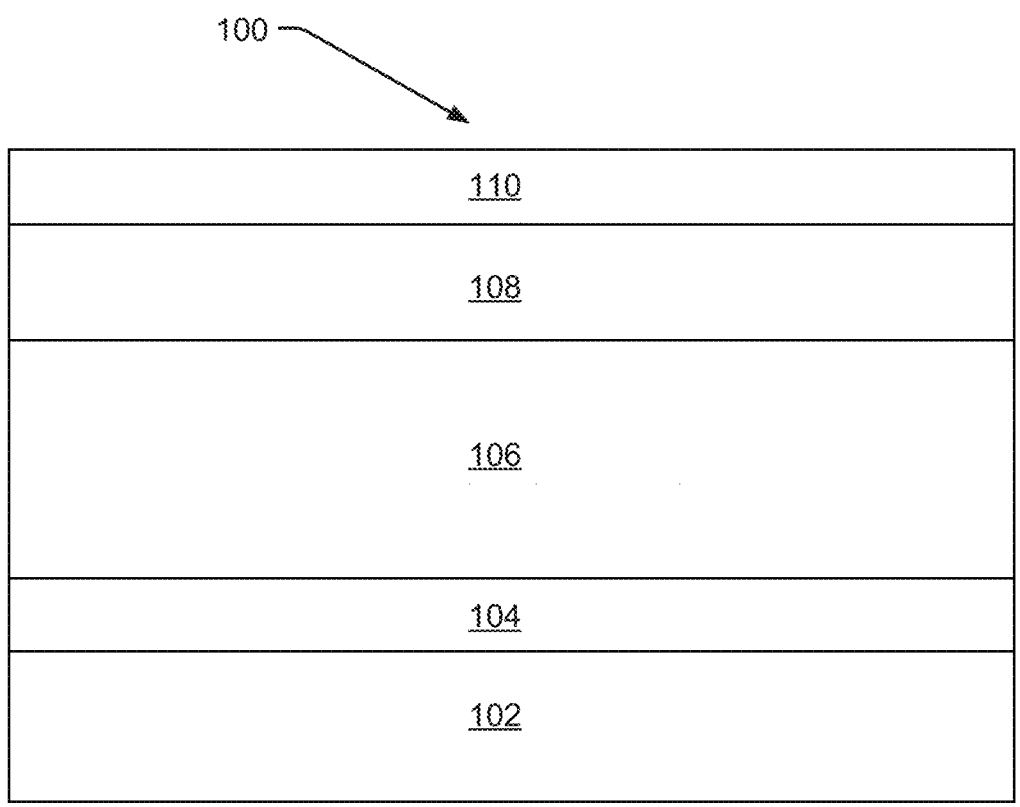
FIG. 1 illustrates a conventional HEMT device.

Typically, as shown in FIG. 1, conventional AlGaN/GaN HEMTs are fabricated on a substrate 102. The substrate 102 may be, for example, fabricated from one of silicon, silicon carbide, and sapphire. A nucleation layer 104 of approximately 10-500 nm is formed on the substrate 102. A buffer layer 106 of about 3-7 µm is formed on the nucleation layer 104 followed by the GaN channel layer 108 and the AlGaN barrier layer 110. Buffer layer 106 provides a transition between the nucleation layer 104 and the GaN channel layer 108 and is designed to reduce dislocations and defects in the GaN channel layer 108. The contacts (not shown), such as drain contact, source contact, and the gate contact, are formed on the AlGaN barrier layer 110.

In operation, on application of positive voltage at the drain contact, Two-Dimensional Electron Gas (2DEG) is formed between the GaN channel layer 108 and the AlGaN barrier layer 110 and the HEMT is switched ON, hereinafter referred to as ON state of the HEMT 100. When negative voltage is applied at the gate contact, the 2DEG gets depleted and the HEMT 100 is switched off, hereinafter referred to as OFF state of HEMT 100.

In the OFF state of HEMT 100, there may be a parasitic leakage current which flows through the buffer layer 106. Thus, in the OFF state, when high drain voltage is applied, for example, in high power applications, presence of the parasitic leakage current reduces the breakdown voltage of the HEMT 100 which can be detrimental in high power applications. The parasitic leakage current, hereinafter referred to as leakage current may be of two types—(a) lateral leakage current: from the drain contact to the source contact through the buffer layer 106; and (b) vertical leakage current: from the drain contact to the substrate 102 through the buffer layer 106.

Vertical leakage current is an inverse function of thickness of the buffer layer 106. Thus, to reduce vertical leakage current, thickness of the buffer layer 106 may be increased. However, this can alter the electrical characteristic of the HEMT 100. Another technique for reducing the leakage current aims to reduce dislocations and defects in the buffer layer 106 and increase resistivity of the buffer layer 106.

Lower dislocation in the buffer layer 106 helps in reducing both the lateral and vertical leakage current and also improves quality of the 2DEG. Further, lowering the dislocations and defect in the buffer layer 106 also helps in ensuring presence of compressive stresses which can lower bow of the wafer or formation of cracks in the HEMT. To reduce dislocations and defects, conventional buffer layer 106 include AlN/GaN super lattice structure, $Al_xGa_{1-x}N/Al_yGa_{1-y}N$ super lattice structures, and thick GaN layers counter doped with C, Fe or Mg, GaN along with $Al_{83}In_{17}N$.

It is also known that high resistivity in the buffer layer 106 can be obtained by reducing number of free electrons in the buffer layer 106. The number of free electrons in the buffer layer 106 may be reduced, for example, by counter doping the buffer layer with carbon, magnesium, and iron.

Thus, conventionally, to reduce dislocations and defects in the buffer layer 106 and to increase resistivity of the buffer layer 106 two different techniques are used in the buffer layer, i.e., reduction of dislocation or defects is achieved by using the AlGaN transition layer or super lattices structures and high resistivity is achieved with counter doping the buffer layer with C, Mg, or Fe. This increases material and manufacturing costs of the HEMT.

In another technique, to reduce leakage current, the buffer layer 106 has been fabricated from GaN lateral p-n junctions. In this technique, alternate p-doped and n-type layers are fabricated perpendicular to the substrate. However, in HEMTs fabricated with GaN lateral p-n junctions, the p-doped GaN of the buffer layer contacts the GaN channel layer 108. The p-type dopant in p-doped GaN of the buffer layer can diffuse into the GaN channel layer 108 and can lead to reduced electron mobility in the GaN channel layer 108. Further, GaN lateral p-n junction-based buffer layer is generally realized by ion implantation and re-growth process. This increases cost of manufacture of the HEMT. Further, with ion implantation the defect density may increase in the buffer layer which can, consequently, contribute to an increase in leakage current.

The present subject matter helps to achieve both defect reduction and high resistivity using a single technique, that is by stacked p-n junctions. The HEMT comprises a substrate, a nucleation layer, a buffer layer, a channel layer, and a barrier layer. The nucleation layer is provided on the substrate. The buffer layer, formed between the nucleation and the channel layer, comprises a vertical stack of p-n junctions to reduce leakage current in the buffer layer. For ease of discussion, as used herein, p-n junction refers to an n-type layer and a p-type layer placed in contact with each other, and not just to the interface between the n-type and p-type layer. The layers in the p-n junction are placed substantially parallel to the substrate. For example, the substrate has a first end and a second end, and the vertical stack is provided such that each p-n junction extends from the first end to the second end of the substrate.

In one example, in one p-n junction, an n-type layer is provided on a p-type layer. Over the n-type layer, the p-type layer of the next p-n junction is placed and so on, thereby forming a vertical stack of p-n junctions. Thus, at the interface of two p-n junctions also a p-n junction interface is formed.

In one example, the base of the vertical stack, which is closer to the substrate, may be formed of a p-type layer and the top of the vertical stack, is closer to the channel layer may be formed of an n-type layer.

In operation, depletion region formed between the p-type layer and the n-type layer in each p-n junction and between the p-n junctions reduces the number of free electrons in the buffer layer. This helps in increasing the resistivity of the buffer layer and decreasing leakage current of the device. The doping in the p-type layer and the n-type layer helps in reducing dislocation density and defects in the buffer layer which also contributes to reducing the leakage current. Further, in the HEMT of the present subject matter, the n-type layer is closer to the channel layer than the p-type layer. This reduces chances of diffusion of p-type dopant into the channel layer, thus, the 2DEG between channel layer and the barrier layer remains unaffected, thereby, improving the electrical characteristics of the HEMT.

As the HEMT comprises vertical p-n junctions in the buffer layer, epitaxial techniques, such as Metal-Organic Chemical Vapour Deposition (MOCVD) and Molecular Beam Epitaxy (MBE) can be used to sequentially grow one layer above the other without requiring complex techniques, such as ion implantation, regrowth, and the like, thereby, reducing complexity and cost of manufacture. The cost of manufacture is further reduced as the defect density reduction and high resistivity of buffer layer is achieved through single technique, i.e., by vertical p-n junctions.

In an example, the vertical stack of p-n junctions of the buffer layer are grown on a transition layer which is formed on the nucleation layer. The HEMT can also comprise other layers, for example, a Dispersion Blocking Layer (DBL) can be provided between the channel layer and the buffer layer to further block dispersion of dopants from the buffer layer to the channel layer. In one example, interlayers can be provided in the buffer layer to further reduce dislocation density and to prevent bowing by adjusting mean compressive stress in the buffer layer.

The above and other features, aspects, and advantages of the subject matter will be better explained with regard to the following description and accompanying figures. It should be noted that the description and figures merely illustrate the principles of the present subject matter along with examples described herein and, should not be construed as a limitation to the present subject matter. It is thus understood that various arrangements may be devised that, although not explicitly described or shown herein, embody the principles of the present disclosure. Moreover, all statements herein reciting principles, aspects, and examples thereof, are intended to encompass equivalents thereof. Further, for the sake of simplicity, and without limitation, the same numbers are used throughout the drawings to reference like features and components.

Figure 2:
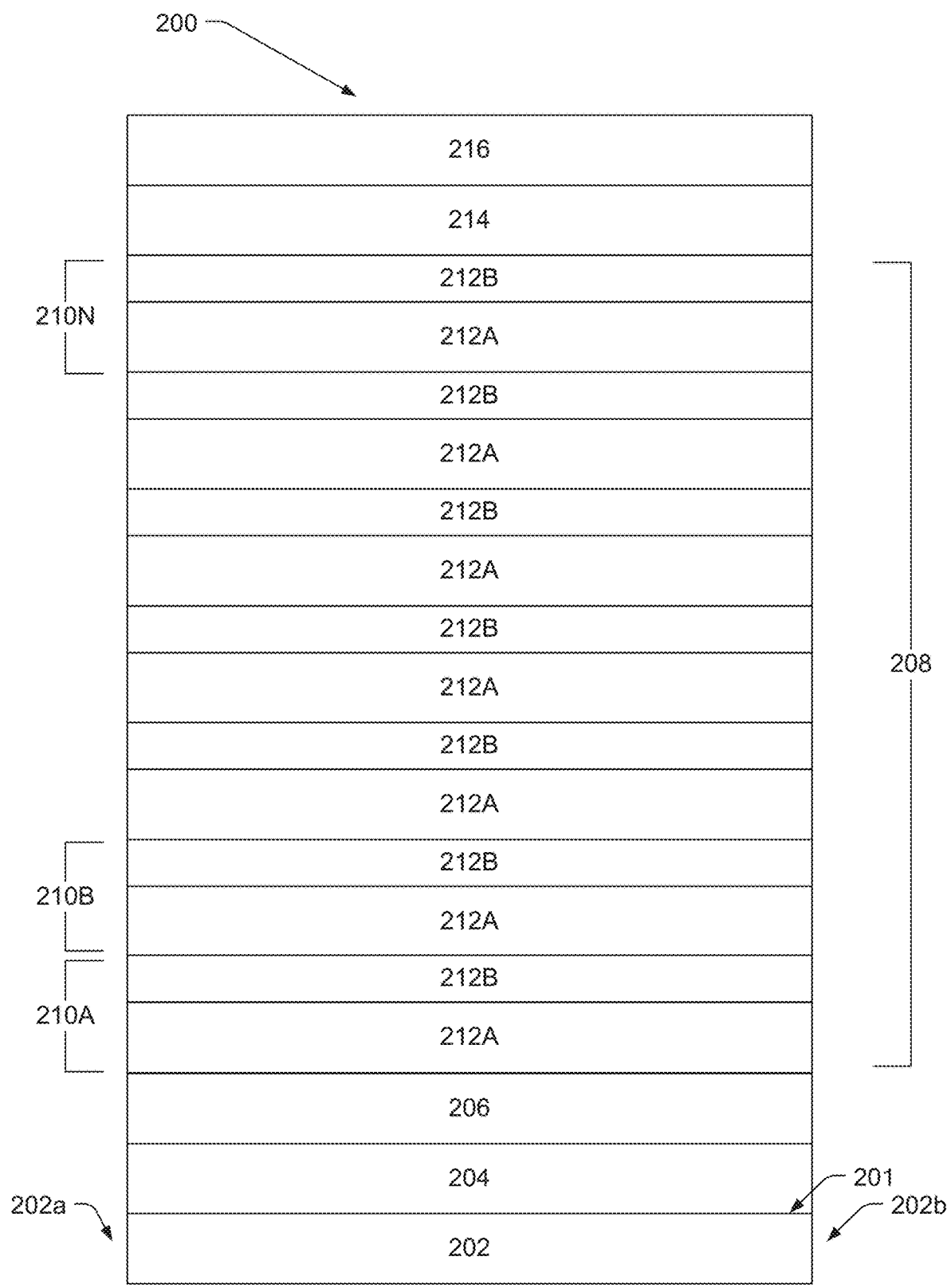
FIG. 2 illustrates an example HEMT of the present subject matter, in accordance with an implementation of the present subject matter.

FIG. 2 illustrates a High Electron Mobility Transistor (HEMT) 200 of the present subject matter, in accordance with an implementation of the present subject matter. The HEMT 200 comprises a substrate 202, a nucleation layer 204, a buffer layer 208, and a channel layer 214. The buffer layer 208 may be formed between the nucleation layer 204 and the channel layer 214.

The substrate 202 may be fabricated from one of silicon, silicon carbide, and sapphire. In an example, a thickness of the substrate 202 is in a range of 0.5 mm to 2 mm. The substrate 202 has a first surface 201 on which the nucleation layer 204 may be formed. The substrate 202 extends between a first end 202*a* and a second end 202*b*, which corresponds to the width of the HEMT.

The nucleation layer 204 formed on the substrate 202 may be fabricated from aluminium nitride or gallium nitride. In an example, a thickness of the nucleation layer 204 is in a range of 50 nm to 500 nm In one example, the buffer layer 208 may be formed on the nucleation layer 204. In another example, a transition layer 206 can be formed on the nucleation layer 204 and the buffer layer 208 may be formed over the transition layer 206. The transition layer 206 may be fabricated from aluminum nitride to form a smooth transition and to prevent lattice mismatch between the nucleation layer 204 and the buffer layer 208 formed on the transition layer 206.

The buffer layer 208 comprises a vertical stack of p-n junctions 210a, 210b . . . , hereinafter referred to as p-n junction 210. Each p-n junction comprises a p-type layer 212a and an n-type layer 212b provided on the p-type layer 212a. The p-type layer 212a of a next p-n junction 210 is provided over the n-type layer 212b and so on. The p-type layer 212a and the n-type layer 212b are formed parallel to the substrate 202, i.e., each of the n-type layer 212b and the p-type layer 212a extend over the width of the HEMT from the first end 202a to the second end 202b. The p-type layer 212a of a subsequent p-n junction is placed over the n-type layer 212b of a preceding p-n junction. For example, the p-type layer 212a of the p-n junction 210b is placed over the n-type layer 212b of the p-n junction 210a.

In an example, each p-type layer 212a is fabricated from magnesium doped gallium nitride and each n-type layer 212b is fabricated from silicon doped gallium nitride. Depletion regions formed between the p-type layers 212a and n-type layers 212b help reduce leakage current in the buffer layer 208. Further, the doping in p-type layer 212a and n-type layer 212b help in reducing dislocations and defects in the buffer layer 208 further contributing to the reduction in leakage current.

While the present subject matter has been explained with magnesium as p-type dopant and silicon as n-type dopant, other p-type and n-type dopants may also be used. Further, each p-n junction can have different p-type dopants and n-type dopants in the p-type layer 212a and n-type layer 212b. The compressive stress generated with Mg doping and tensile stress generated with Si doping can be used to adjust the stress levels in the wafer and hence bowing of the wafer and cracking of the film.

In one example, a number of p-n junctions in the buffer layer 208 is seven. However, it is to be understood that any number of p-n junctions may be provided in the buffer layer 208. The buffer layer 208 can have a thickness in a range of 3-7 μm. In an example, a thickness of the p-type layer 212a and the n-type layer 212b is in a range of 300-500 nm and 30-40 nm, respectively. However, it is to be understood that other thicknesses are possible depending on required final thickness of the buffer layer 208 and the HEMT 200. In an example, thickness of the p-type layer 212a and n-type layer 212b may be designed such that a thickness of the buffer layer 208 is 3-7 μm.

In an example, doping concentration of the p-type layer is in a $1\times10^{16}$ cm$^{-3}$ to $1\times10^{18}$ cm$^{-3}$ and doping concentration in the n-type layer is in a range of $1\times10^{16}$ cm$^{-3}$ to $1\times10^{18}$ cm$^{-3}$. However, it is to be understood that other doping concentrations are possible, for example, to maintain balance charges and to maintain a low electric field at the p-n junction during a reverse bias mode. The doping concentrations in the p-type layer and the n-type layer may be selected to balance charges. Further, the doping concentrations of the p-type layer 212a and the n-type layer 212b may be varied based on the thickness of the layers to balance charges between the two layers and to ensure absence of free electrons in the buffer layer 208. For example, the n-type layer 212b may be thicker than the p-type layer 212a while having lower doping concentration than the p-type layer 212a.

The channel layer 214 can be formed over the buffer layer 208. In an example, the channel layer 214 is fabricated from gallium nitride. The channel layer 214 may be formed on a topmost n-type layer of the buffer layer 208. A barrier layer 216 can be formed on the channel layer 214. In one example, the barrier layer 216 is fabricated from AlGaN. As will be understood, source electrode, gate electrode, and drain electrode may be provided on the barrier layer 216.

Figure 3:
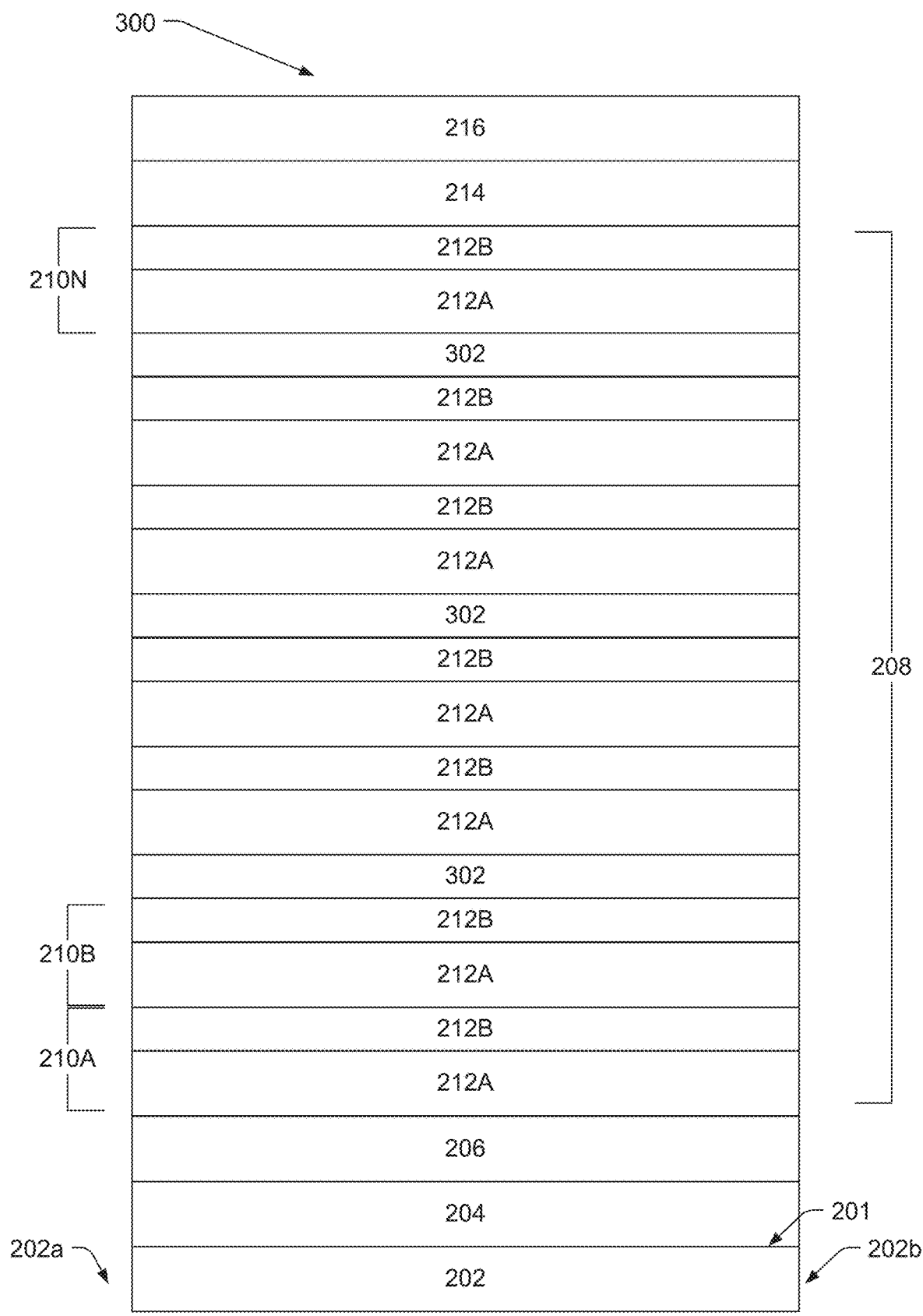
FIG. 3 illustrates another example HEMT, in accordance with an implementation of the present subject matter.

FIG. 3 depicts another example HEMT 300, in accordance with an implementation of the present subject matter. As shown in FIG. 3, the buffer layer 208 comprises an interlayer 302 provided between a pair of p-n junctions in the buffer layer 208. In one example, a plurality of interlayers 302 may be interspersed between alternate pairs of p-n junctions in the buffer layer 208. In an example, the interlayer is fabricated from AlN. The plurality of interlayers 302 help in adjusting mean compressive stress because of the differences in lattice parameters of AlN and GaN in the buffer layer 208. In an example, each interlayer of the plurality of interlayers 302 is formed between alternate pairs of p-n junctions of the vertical stack of p-n junctions. However, other configurations are possible, as will be understood.

Figure 4:
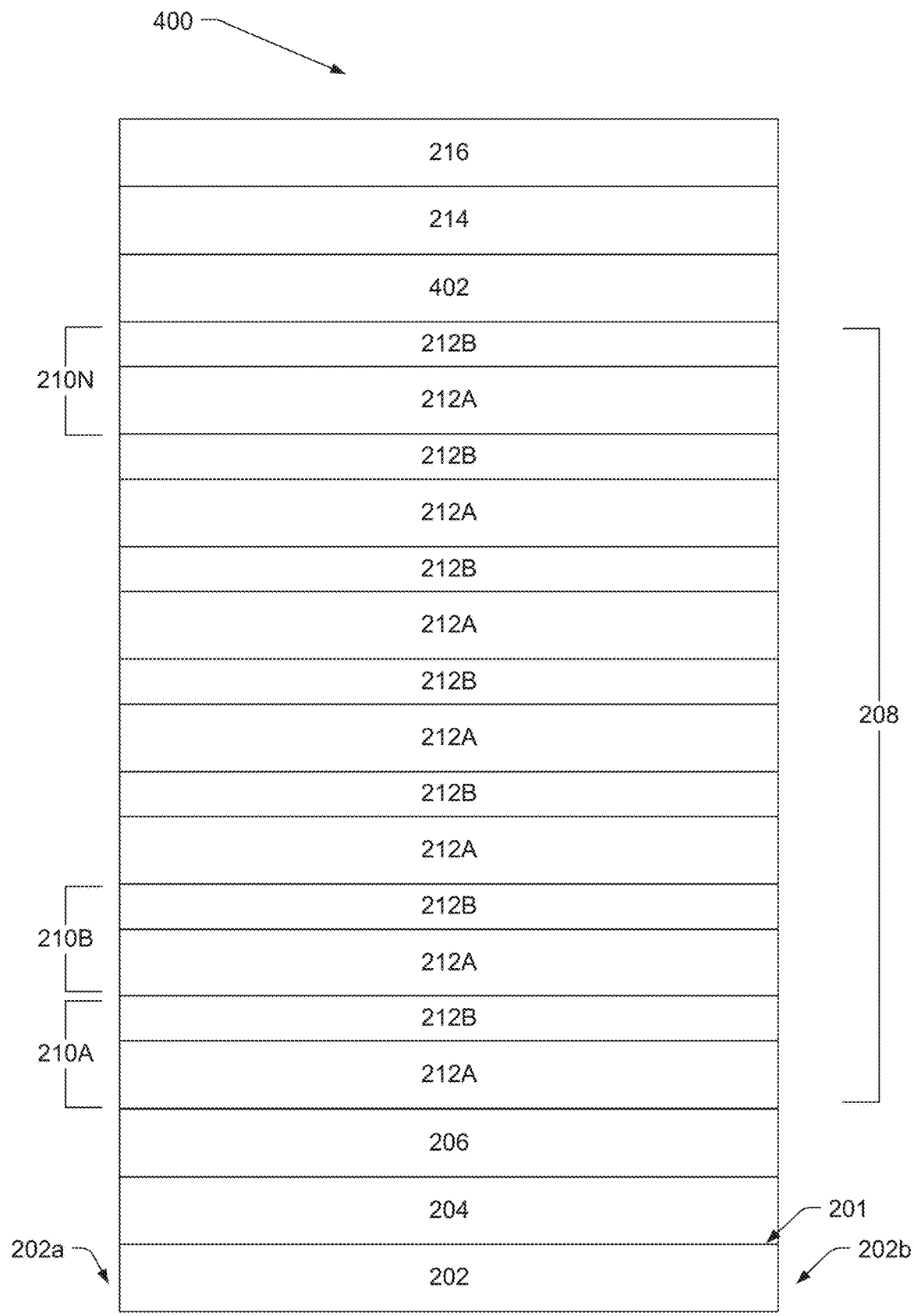
FIG. 4 illustrates another example HEMT, in accordance with an implementation of the present subject matter.

FIG. 4 depicts yet another HEMT 400, in accordance with an implementation of the present subject matter. In the HEMT 400 as shown in FIG. 4, a Dispersion Blocking Layer (DBL) 402 is formed over the topmost n-type layer 212b. The DBL 402 helps in reducing dispersion of channel electrons and dopants from traps present in the buffer layer 208. The DBL 402 may be fabricated from one of: AlN, $Al_xGa_{1-x}N$, and $Al_xIn_yGa_{1-x-y}N$. In another example, the HEMT may have both the interlayer 302 and the DBL 402 though now shown.

The present subject matter will now be illustrated with working examples, which are intended to illustrate the working of disclosure and not intended to be taken restrictively to imply any limitations on the scope of the present disclosure. Unless defined otherwise, all technical and scientific terms used herein have the same meaning as commonly understood to one of ordinary skill in the art to which this disclosure belongs. It is to be understood that this disclosure is not limited to the particular methods and experimental conditions described, as such methods and conditions may vary depending on the process and inputs used as will be easily understood by a person skilled in the art.

EXAMPLES

Example 1: Thickness and Doping Concentration Study

Figure 5A:
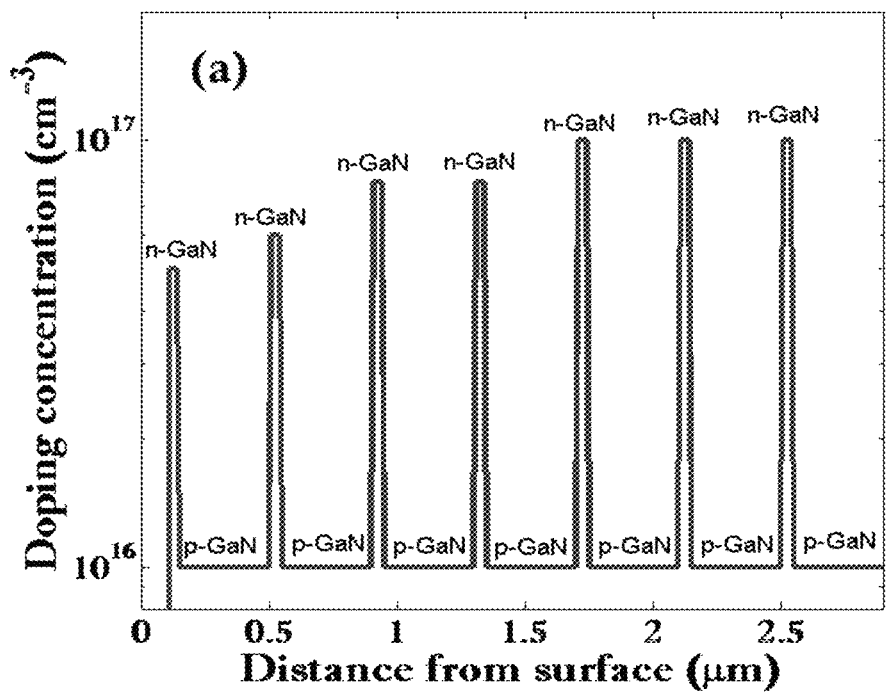
FIG. 5(a) shows thicknesses and doping concentrations of a buffer layer in the HEMT, in accordance with an implementation of the present subject matter.
Figure 5B:
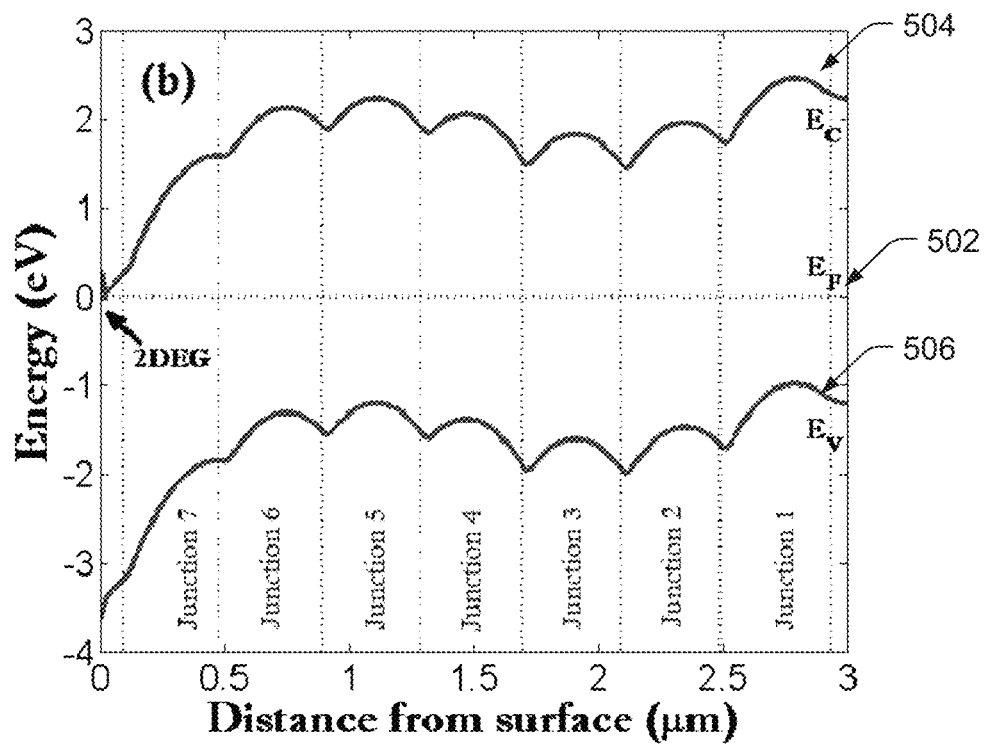
FIG. 5(b) shows Fermi level variation in the buffer layer, in accordance with an implementation of the present subject matter.

FIG. 5(a) shows thicknesses and doping concentrations of each p-type and n-type layer of the buffer layer 208, in accordance with an implementation of the present subject matter. The thickness of the p-doped and n-type layer were 400 nm and 40 nm, respectively. The doping concentration of all p-type layer and in the p-n junction stack were kept at $1\times10^{16}$ cm$^{-3}$. The doping concentration of n-type layer was varied from $1\times10^{17}$ cm$^{-3}$ to $5\times10^{16}$ cm$^{-3}$. Doping levels in p-type layer and n-type layer were designed at a moderate value to maintain a low electric field in the p-n junction in the reverse bias mode. Fermi level, as depicted by line 502, in the buffer layer was found to be almost equidistant from minimum of conduction band edge, as depicted by line 504, and maximum of valence band edge, as depicted by like 506, as shown in FIG. 5(b). This provides an example buffer layer with a low concentration of free carriers.

Similarly, in other examples, other thicknesses and doping concentrations of the n-type and p-type layers may be suitably selected to balance charges between the two layers and to ensure absence of free electrons in the buffer layer.

Example 2: Leakage Current Comparison

Figures 6A, 6B, 6C:
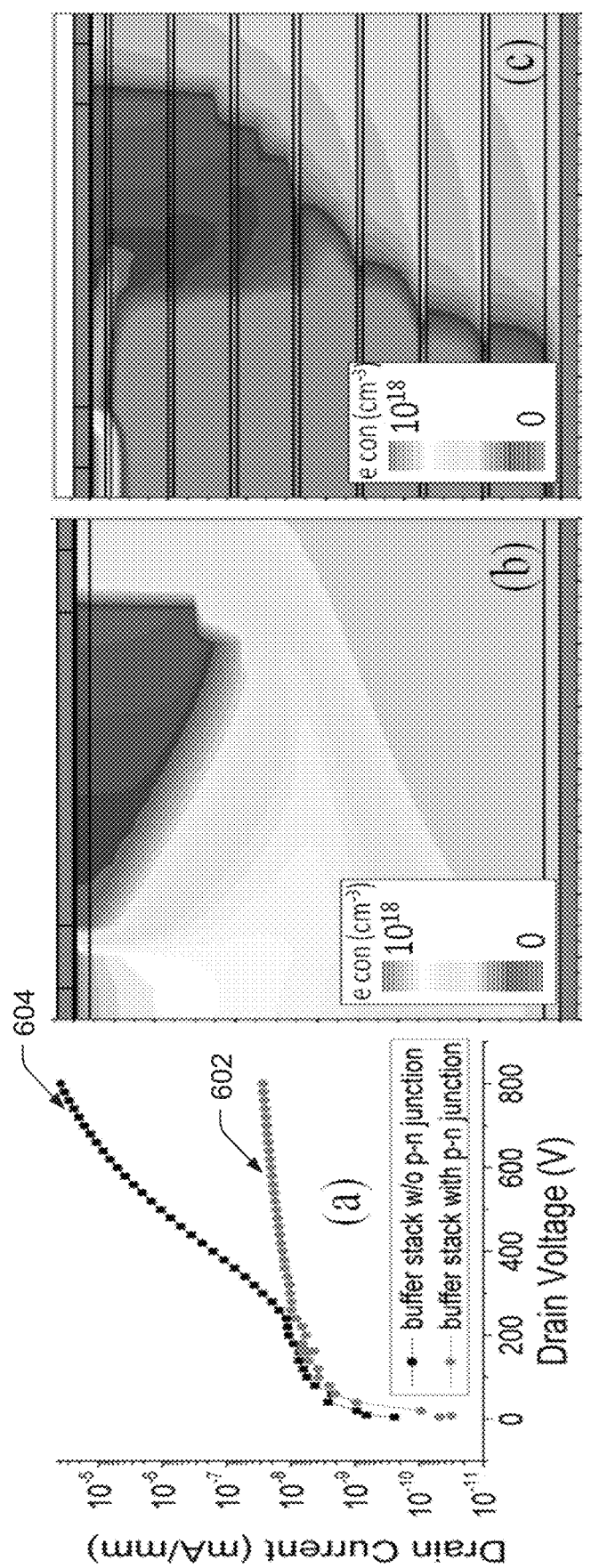
FIG. 6(a) compares the leakage current of HEMT with multiple p-n junction and without any p-n junction, in accordance with an implementation of the present subject matter.
FIG. 6(b) shows electron concentration plot for HEMT without multiple p-n junctions, in accordance with an implementation of the present subject matter.
FIG. 6(c) shows electron concentration plot for HEMT with multiple p-n junctions, in accordance with an implementation of the present subject matter.

FIG. 6 (a) compares the leakage current of HEMT with multiple p-n junction, as depicted by line 602, and without any p-n junction, as depicted by line 604, in accordance with an implementation of the present subject matter. The leakage current was found to be about 3 orders of magnitude less in case of multiple p-n junction buffer layer at 600 V drain voltage.

FIGS. 6 (b) and (c) shows electron concentration color plot with 600 V on drain terminals of buffer layer without p-n junction and buffer layer with multiple p-n junctions, respectively. In the buffer layer without p-n junction, the buffer layer was fabricated using GaN but no doping was introduced. It was observed that gate punch through, i.e., lateral leakage current, occurs at high drain voltage in the case of buffer layer without any p-n junction. However, in case of buffer layer with multiple p-n junction, no lateral leakage current was observed.

Figure 7A:
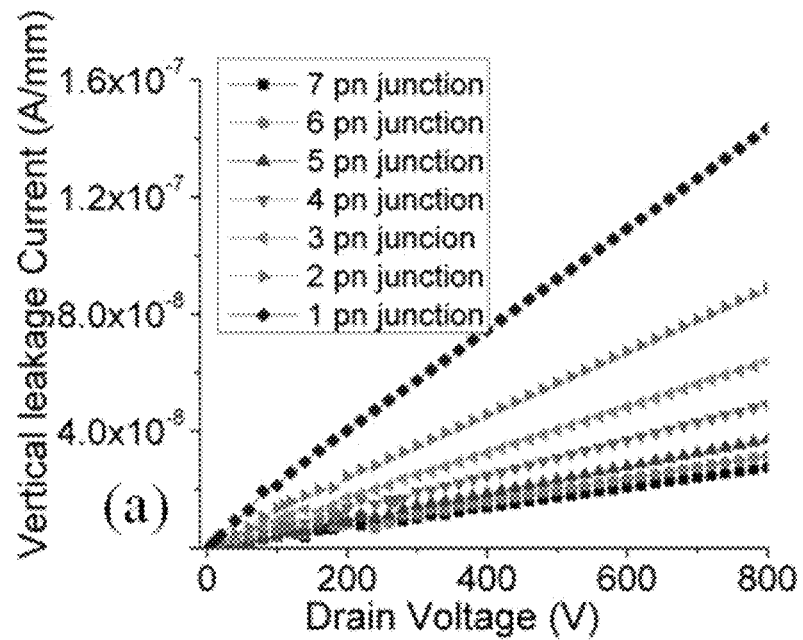
FIG. 7(a) compares vertical leakage current with increasing number of p-n junctions in the buffer layer in linear scale, in accordance with an implementation of the present subject matter.
Figure 7B:
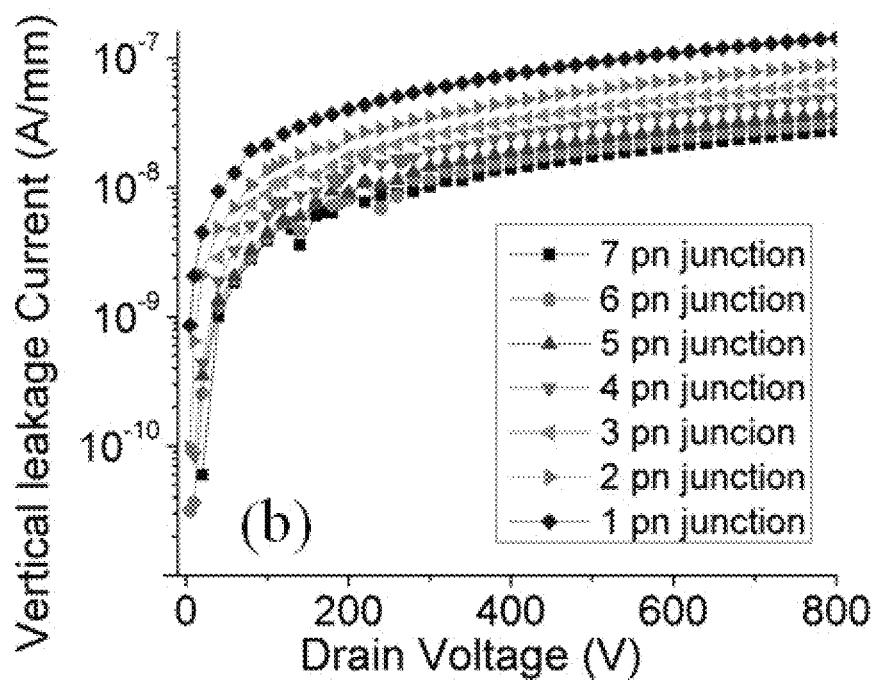
FIG. 7(b) compares vertical leakage current with increasing number of p-n junctions in the buffer layer in logarithmic scale, in accordance with an implementation of the present subject matter.

FIGS. 7 (a) and (b) compares the vertical leakage current with increasing number of p-n junctions in the buffer layer in linear scale and logarithmic scale, respectively, in accordance with an implementation of the present subject matter. The vertical leakage current in the device was observed to decrease as the number of reverse biased p-n junctions increased between drain and gate electrode.

Example 4: Low Dislocation/Defect Density

Silicon doping of GaN is well studied for its effect on dislocation bending. A reduction of dislocation density from $5 \times 10^9$ cm$^{-2}$ to $8 \times 10^8$ cm$^{-2}$ for a Si doping concentration of $3 \times 10^{18}$ cm$^{-3}$ has been reported. However, Si doping the buffer layer can result in the increase in the leakage current of HEMTs. This is because Si acts as an n-type dopant in GaN.

The present example with Mg doping in GaN revealed that Mg also helps in reducing dislocations and dislocation bending in GaN. High resolution Transmission Electron Microscopy (TEM) imaging was conducted to understand effect of Mg on dislocations. FIGS. 8 (a) and (b) show the cross sectional TEM image of the Mg doped GaN sample. The GaN sample was Mg doped GaN (1000 nm) grown on silicon substrate with MN nucleation layer (150 nm). A clear bending of dislocations was observed in the GaN from the point at which Mg doping was initiated.

Therefore, both n-type doping and p-type doping help to reduce the dislocation density in GaN. If Mg or Si alone were used as dopants in the buffer layer, the leakage current was found to increase. On using p-n junctions with optimized doping concentrations and thickness, the leakage current can be reduced by the depletion region associated with the p-n junctions in the buffer.

Example 5: Prevention of Cracking and Final Bow Management

The dopant atoms substitute parent atom while doping. If the size of dopant atom is different from that of parent atom, doping results in change in the stress level within the buffer layer. Si (110 pm) is smaller than Ga (130 pm), whereas Mg (150 pm) is bigger. Therefore, doping GaN with Si generates tensile stress in the GaN layer while doping GaN with Mg generates compressive stress.

FIGS. 9 (a) and (b) shows the experimental result of stress variation in GaN with Si and Mg doping, respectively, in accordance with an implementation of the present subject matter. Negative sign in the y-axis represents compressive stress. The compressive stress level in GaN is decreased with Si and the compressive stress in GaN is increased with Mg doping. Since the effect of doping with Si and Mg in GaN are opposite in nature, the doping levels can be adjusted to have an appropriate mean stress in the film such that the final bow of the wafer after cooling down will be within a permissible limit. It should also be mentioned that the size related stress effect will be seen only if the dislocation density in the film is less. Otherwise both Si and Mg will aid in dislocation bending and result in tensile stress generation in the film.

From the above, by using a vertical stack of p-n junctions in the buffer layer, various advantages can be obtained. The depletion region of the vertical stack of p-n junctions help to obtain low carrier density in the buffer layer, resulting in low leakage current. Si and Mg doping in the buffer layer filters out dislocations and result in low dislocation/defect density. This further contributes to low leakage current and better quality 2DEG. The cost of manufacture and production can be substantially reduced as it is easy to create a vertical stack of layers by growing different layers, each having desired thickness and doping concentrations. Also, the mean stress in the buffer layer can be adjusted with doping levels and thicknesses of individual p-type and n-type region. The number of p-n junction in the stack can also be used a parameter to optimize the mean stress. Thus, cracking can be prevented, and final bow management can be easily achieved.

Although the subject matter has been described in considerable detail with reference to certain examples and implementations thereof, other implementations are possible. As such, the scope of the present subject matter should not be limited to the description of the preferred examples and implementations contained therein.

We claim:

1. A High Mobility Electron Transistor (HEMT) comprising:
    a substrate;
    a nucleation layer provided on the substrate;
    a channel layer; and
    a buffer layer formed between the nucleation layer and the channel layer, wherein the buffer layer comprises a vertical stack of p-n junctions to reduce leakage current in the buffer layer, wherein each p-n junction of the vertical stack of p-n junctions comprises:
        an n-type layer; and
        a p-type layer, wherein the n-type layer is provided on the p-type layer, wherein the n-type layer and the p-type layer are parallel to the substrate.

2. The HEMT as claimed in claim 1, wherein the substrate extends between a first end and a second end forming a width of the HEMT and wherein the n-type layer and the p-type layer of the vertical stack of p-n junctions extends across the width of the HEMT.

3. The HEMT as claimed in claim 1 comprising a transition layer formed between the nucleation layer and the buffer layer.

4. The HEMT as claimed in claim 1, wherein the buffer layer comprises an interlayer formed between a pair of p-n junctions of the vertical stack of p-n junctions.

5. The HEMT as claimed in claim 1 comprising a Dispersion Blocking Layer (DBL) formed between the channel layer and the buffer layer.

6. The HEMT as claimed in claim 1, wherein:
the nucleation layer is fabricated from one of:
aluminium nitride and gallium nitride;
the n-type layer is fabricated from silicon doped gallium nitride; and
the p-type layer is fabricated from magnesium doped gallium nitride.

7. The HEMT as claimed in claim 1, wherein a doping concentration and a thickness of the n-type layer and the p-type layer in each p-n junction is selected to balance charges in the p-n junction.

8. The HEMT as claimed in claim 7, wherein the doping concentration of the p-type layer is in a range of $1\times10^{16}$ $cm^{-3}$ to $1\times10^{18}$ $cm^{-3}$.

9. The HEMT as claimed in claim 7, wherein the doping concentration of the n-type layer is in a range of $1\times10^{16}$ $cm^{-3}$ to $1\times10^{18}$ $cm^{-3}$.

10. The HEMT as claimed in claim 7, wherein the thickness of the p-type layer is in a range of 300-500 nm and the thickness of the n-type layer is in a range of 30-50 nm.

11. The HEMT as claimed in claim 1, wherein a thickness of the buffer layer is in a range of 3-7 µm.

12. The HEMT as claimed in claim 3, wherein the transition layer is fabricated from aluminum nitride.

13. The HEMT as claimed in claim 1, the p-type layer of a subsequent p-n junction is placed over the n-type layer of a preceding p-n junction.

* * * * *